US009349870B2

(12) United States Patent
Wang et al.

(10) Patent No.: US 9,349,870 B2
(45) Date of Patent: May 24, 2016

(54) METHOD FOR FORMING LOW-TEMPERATURE POLYSILICON THIN FILM, THIN FILM TRANSISTOR AND DISPLAY DEVICE

(71) Applicant: BOE TECHNOLOGY GROUP CO., LTD., Beijing (CN)

(72) Inventors: Lei Wang, Beijing (CN); Xueyan Tian, Beijing (CN); Jang Soon Im, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/365,227

(22) PCT Filed: Dec. 10, 2013

(86) PCT No.: PCT/CN2013/088910
§ 371 (c)(1),
(2) Date: Jun. 13, 2014

(87) PCT Pub. No.: WO2015/043081
PCT Pub. Date: Apr. 2, 2015

(65) Prior Publication Data
US 2015/0091010 A1    Apr. 2, 2015

(30) Foreign Application Priority Data

Sep. 29, 2013  (CN) .......................... 2013 1 0455936

(51) Int. Cl.
*H01L 21/20*    (2006.01)
*H01L 29/786*    (2006.01)
(Continued)

(52) U.S. Cl.
CPC .... *H01L 29/78675* (2013.01); *H01L 21/02532* (2013.01); *H01L 21/02678* (2013.01);
(Continued)

(58) Field of Classification Search
CPC .................. H01L 29/78675; H01L 21/02532; H01L 21/02592; H01L 21/02678; H01L 21/0276; H01L 21/02164; H01L 21/0217; H01L 29/78606

USPC .................. 438/479, 149, 48, 128, 151, 157; 257/59, 72, E23.164, E21.151
See application file for complete search history.

(56) References Cited

U.S. PATENT DOCUMENTS 5,466,617 A *  11/1995  Shannon ........................ 438/155
6,991,974 B2 *  1/2006  Tsao .............................. 438/151
(Continued)

FOREIGN PATENT DOCUMENTS

CN          1581427 A         2/2005
CN        101168474 A         4/2008
(Continued)

OTHER PUBLICATIONS

International Search Report and Written Opinion of the International Searching Authority with Notice of Transmittal of the International Search Report and Written Opinion of PCT/CN2013/0889108 in Chinese, mailed Jun. 30, 2014.
(Continued)

*Primary Examiner* — Thinh T Nguyen
(74) *Attorney, Agent, or Firm* — Collard & Roe, P.C.

(57) ABSTRACT

A method for forming low-temperature polysilicon thin film, a thin film transistor and a display device are provided. The method for forming low-temperature polysilicon thin film comprises: depositing an amorphous silicon thin film on a base substrate; covering the amorphous silicon thin film with an anti-reflective optical film; performing photolithography and etching on the anti-reflective optical film such that light condensing structures are provided in an array on the antireflective optical film; and irradiating the amorphous silicon thin film with the anti-reflective optical film covered by laser light such that the amorphous silicon film is converted into the low-temperature polysilicon thin film. The method may improve the grain size and uniformity of the low-temperature polysilicon thin film, make full use of the energy of the incident laser light, facilitate the reduction of the production cost of the low-temperature polysilicon thin film, and improve the performance of the low-temperature polysilicon thin film transistor.

9 Claims, 2 Drawing Sheets

(51) Int. Cl.
H01L 21/02 (2006.01)
H01L 29/49 (2006.01)
H01L 29/66 (2006.01)
H01L 27/12 (2006.01)

(52) U.S. Cl.
CPC ...... H01L21/02686 (2013.01); H01L 27/1225 (2013.01); H01L 29/4908 (2013.01); H01L 29/66757 (2013.01); H01L 29/78606 (2013.01); H01L 21/0217 (2013.01); H01L 21/02164 (2013.01)

(56) References Cited

U.S. PATENT DOCUMENTS

2003/0061984 A1 4/2003 Maekawa et al.
2008/0067515 A1 3/2008 Park et al.
2008/0073656 A1 3/2008 Peng et al.

FOREIGN PATENT DOCUMENTS

| CN | 203456472 U | 2/2014 |
| JP | 2002-57344 A | 2/2002 |
| JP | 2005-209927 A | 8/2005 |

OTHER PUBLICATIONS

Chinese Office Action of Chinese Application No. 201310455936.9, mailed Jul. 24, 2015 with English translation.

English translation of the International Preliminary Report on Patentability and Written Opinion of the International Searching Authority of PCT/CN2013/088910, issued Mar. 29, 2016.

* cited by examiner

METHOD FOR FORMING LOW-TEMPERATURE POLYSILICON THIN FILM, THIN FILM TRANSISTOR AND DISPLAY DEVICE

CROSS REFERENCE TO RELATED APPLICATIONS

This application is the National Stage of PCT/CN2013/088910 filed on Dec. 10, 2013, which claims priority under 35 U.S.C. §119 of Chinese Application No. 201310455936.9 filed on Sep. 29, 2013, the disclosure of which is incorporated by reference.

TECHNICAL FIELD

Embodiments of the present invention relate to a method for forming a low-temperature polysilicon thin film, a thin film transistor and a display device.

BACKGROUND

Currently, common active array liquid crystal displays typically use amorphous silicon thin film transistors (TFTs) and polysilicon thin film transistors.

A polysilicon thin film transistor has advantages of higher electron mobility, high aperture ratio, high response speed, the ability of scaling down the component size, high resolution, capability of forming integrated drive circuit and etc., therefore it is suitable for high-frequency display of large capacity, facilitates the yield of the display and cost reduction, and has various applications.

Generally, a low-temperature polysilicon thin film is formed by excimer laser annealing. The fundamental of the excimer laser annealing is to irradiate the surface of an amorphous silicon thin film so that the amorphous silicon is melt, cooled, re-crystallized and then converted into polysilicon. The low-temperature polysilicon thin film formed by excimer laser annealing has advantages of great grain, good space selectivity, and excellent electrical characteristic. The excimer laser annealing has become a predominant method for forming a low-temperature polysilicon thin film.

However, in the current technology, it is difficult to form a low-temperature polysilicon thin film having uniformity and great grains. Furthermore, because the incident laser light is reflected to a great extent, the energy of the incident laser light is wasted greatly, which is detrimental for realizing low cost production of the low-temperature polysilicon thin film and the improvement of the performance of the low-temperature polysilicon thin film.

SUMMARY

In an embodiment of the present invention, a method for forming a low-temperature polysilicon thin film is provided, and the method comprises: depositing an amorphous silicon thin film on a base substrate; covering the amorphous silicon thin film with an anti-reflective optical film; performing photolithography and etching on the anti-reflective optical film such that light condensing structures are provided in an array on the anti-reflective optical film; and irradiating the amorphous silicon thin film with the anti-reflective optical film covered by laser light such that the amorphous silicon film is converted into the low-temperature polysilicon thin film.

In another embodiment of the present invention, a thin film transistor is provided which comprises an active layer disposed on a substrate and a thin insulating film on the active layer. The material of the active layer is a low-temperature polysilicon thin film, the thin insulating film is an anti-reflective optical film, and light condensing structures are arranged in an array on the surface of the anti-reflective optical film.

In yet another embodiment of the present invention, a display device is provided which comprises the above-mentioned thin film transistor.

BRIEF DESCRIPTION OF THE DRAWINGS

To illustrate the technical solutions of the embodiments of the present invention clearly, the drawings accompanying the embodiments will be briefly described in the following. Obviously, the drawings described hereinafter merely relate to some embodiments of the present invention and are by no means restrictive for the scope of the present invention.

REFERENCE NUMERALS

101—substrate; 102—buffer layer; 103—amorphous silicon thin film
103a—amorphous silicon thin film under light condensing structure;
103b—amorphous silicon thin film under unetched region;
104—anti-reflective optical thin film; 105—light condensing structure;
106—crystal nucleus;
107—low-temperature polysilicon thin film; 108—gate;
109—source electrode;
110—drain electrode.

DETAILED DESCRIPTION

For the clarity of the objects, the technical solutions and the advantages of the embodiments of the present invention, the technical solution of the embodiments of the present invention will be described clearly and fully in conjunction with the drawings accompanying the embodiments of the present invention. It is obvious that the embodiments described are some rather than all of the embodiments of the present invention. The embodiments that one of ordinary skill in the art may obtain without any creative work on the basis of the embodiments of the present invention descried herein will fall into the scope of the present invention.

Figure 1:
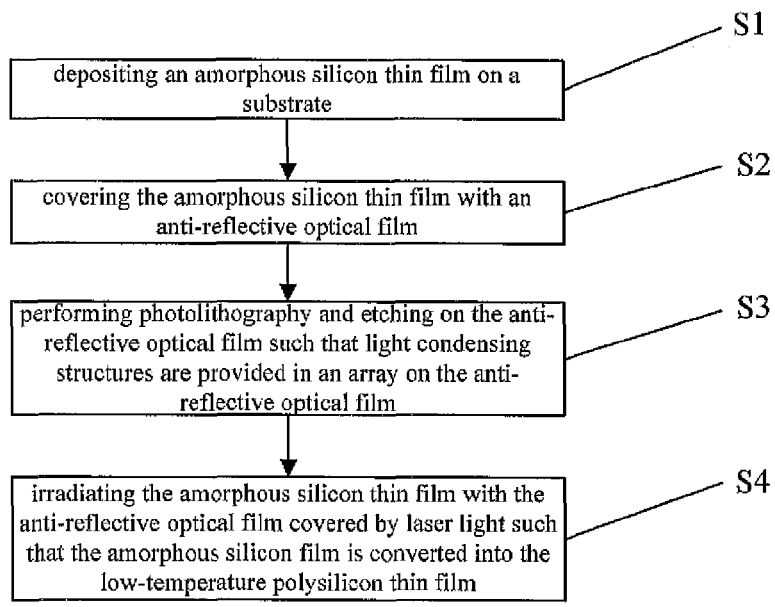
FIG. 1 is a flow chart illustrating a method for forming a low-temperature polysilicon thin film in accordance with an embodiment of the present invention.

An embodiment of the present invention provides a method for forming a low-temperature polysilicon thin film, as shown in FIG. 1, which comprises steps of the following.

Step S1: Depositing an amorphous silicon thin film on a substrate

Figure 2:
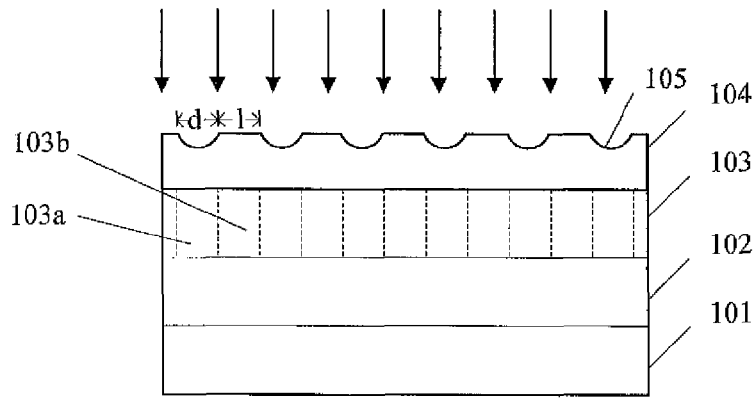
FIG. 2 is a schematic diagram illustrating a method for forming a low-temperature polysilicon thin film in accordance with an embodiment of the present invention.

In the embodiment of the present invention, as shown in FIG. 2, a buffer layer 102 may be deposited on the substrate 101 prior to depositing of the amorphous silicon thin film. The buffer layer 102 may be a silicon nitride or a silicon oxide.

An amorphous silicon thin film 103 is deposited on the substrate 101 with the buffer layer 102 having deposited thereon. Typically, the amorphous silicon thin film 103 is deposited to have a thickness of about 50 nm.

The buffer layer 102 is used to isolate the substrate 101 and the amorphous silicon thin film 103 so as to prevent impurities in the substrate 101 from entering into the amorphous silicon thin film 103 and affecting the performance of the amorphous silicon thin film 103. Furthermore, the buffer layer 102 can reduce the thermal diffusion between the amorphous silicon thin film 103 and the substrate 101, and reduce the influence on the substrate 101 by laser irradiation.

In the embodiment of the present invention, the buffer layer 102 and the amorphous silicon thin film 103 may be deposited by, for example but not limited to, plasma enhanced chemical vapor deposition (PECVD). Other forming method such as low pressure vapor deposition (LPCVD) may also be adopted.

Step S2: Covering the amorphous silicon thin film with an anti-reflective optical film.

As shown in FIG. 2, a thin anti-reflective optical film 104 is deposited on the amorphous silicon film 103. The material of the thin anti-reflective optical film 104 is required to have low absorption coefficient so that the excimer laser light can transmit through it well in effect and the energy of the laser light can effectively applied onto the amorphous silicon thin film 103. Accordingly, the thin anti-reflective optical film 104 may comprise a silicon nitride or a silicon oxide. The thin anti-reflective optical film 104 may be in a single layer or multi-layers and its thickness can be set as required. The principle of the anti-reflection of the laser light by the thin anti-reflective optical film 104 lies in that: the optical path difference between the laser light reflected by the upper surface of the thin anti-reflective optical film 104 and the laser light reflected by the bottom surface of the thin anti-reflective optical film 104 is odd times of half of the wavelength of the laser light, which makes the light reflected by the upper surface and the light reflected by the bottom surface intervene and thus cancel each other out, and the energy of the laser light is completely absorbed by the amorphous silicon thin film 103 and subjected to full of use.

The thickness of the thin anti-reflective optical film 104 may be λ/4 where λ is the wavelength of the laser light propagating in the thin anti-reflective optical film 104. The present invention does not have limit on the thickness of the thin anti-reflective optical film 104 as long as the laser light reflected by the upper surface of the thin anti-reflective optical film 104 and the laser light reflected by the bottom surface of the thin anti-reflective optical film 104 intervene outside the thin anti-reflective optical film 104 to cancel each other out and the energy of the laser light can be fully in use.

In the embodiment of the present invention, the thin anti-reflective optical film 104 may be deposited by PECVD, or be another forming method such as LPCVD or sputter coating.

Step S3: Performing photolithography and etching on the thin anti-reflective optical thin film such that light condensing structures are arranged in an array on the surface of the thin anti-reflective optical thin film.

A layer of photoresist is coated on the thin anti-reflective optical thin film 104 and masking is made with a mask having a pattern corresponding to the light condensing structures 105 arranged in an array. Then the photoresist is exposed and developed, and etching and removing of photoresist is conducted such that light condensing structures 105 are formed on the surface of the thin anti-reflective optical thin film 104. During the formation of the light condensing structures 105, a wet etching process is generally used since it has a characteristic of isotropy. During the etching, the center of the etched region is heavily etched and the edge of the etched region is lightly etched. Therefore, as shown in FIG. 2, the light condensing structures 105 thus formed are in recess structures arranged in an array on surface of the thin anti-reflective optical thin film 104 with the bottom surface of the recesses being of spheral surface.

The light condensing structure 105 having the spheral bottom surface regulates the incident light in a manner similar to a concave lens. That is, the incident laser light is refracted by the light condensing structure 105 such that the incident laser light is condensed on the amorphous silicon thin film under the unetched regions, and the incident laser light is regulated.

The size of the light condensing structure 5 is determined by the mask. Typically, as shown in FIG. 2, the diameter d of the light condensing structure 105 is about 500 nm~5 μm, the minimal distance 1 between edges of two adjacent light condensing structures 105 is about 500 nm~5 μm, and the ratio of the diameter d of the light condensing structure to the minimal distance 1 between edges of two adjacent light condensing structures is about 1:1.

Figure 3:
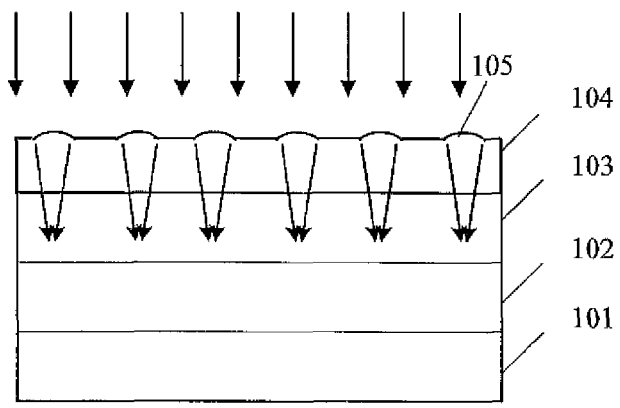
FIG. 3 is a schematic diagram illustrating another method for forming a low-temperature polysilicon thin film in accordance with an embodiment of the present invention.

The light condensing structures may be formed by an isotropic wet etching process or by other etching and pattern forming methods. The bottom surface of the light condensing structure may be spherally recessed like a concave lens. Moreover, any light condensing structure may be used as long as it can regulate the energy distribution of the incident laser light on the amorphous silicon thin film. The light condensing structure may be a single kind of light condensing structure or a combination of a plurality of kinds of light condensing structures. As shown in FIG. 3, there are spheral protrusions on the surface of the thin anti-reflective optical film 104 since light condensing structures similar to convex lens can also regulate the incident laser light. After incident on the surface with the light condensing structures similar to convex lens, the laser light is refracted and condensed on the amorphous silicon thin film under effect of the light condensing structures. With the incident laser light being regulated, local temperature is higher than the peripheral area, and the lateral growth of the grains is facilitated because of the rapid nucleation in the low-temperature.

As shown in FIG. 2, after the light condensing structures 105 are formed on the surface of the thin anti-reflective optical film 104, the amorphous silicon thin film 103 can be divided into an amorphous silicon thin film 103a under the light condensing structures 105 and an amorphous silicon thin film 103b under the unetched region.

Step S4: irradiating the amorphous silicon thin film covered by the thin anti-reflective optical film covered such that the amorphous silicon thin film is converted into a polysilicon thin film.

Figure 4:
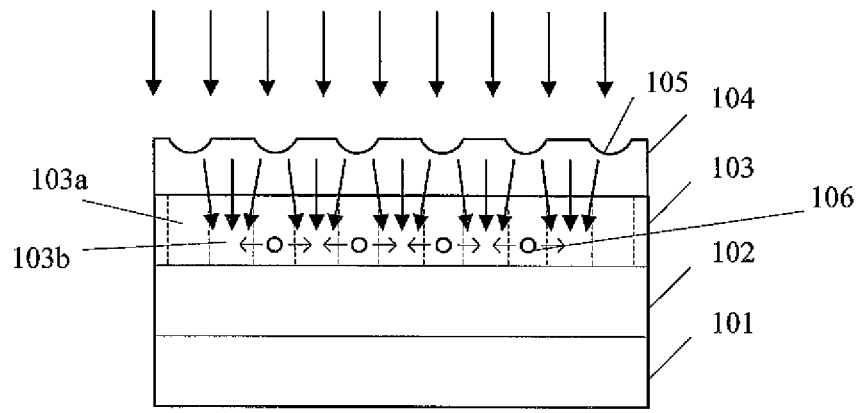
FIG. 4 is a schematic diagram illustrating an annealing process by an excimer laser in accordance with an embodiment of the present invention.

The amorphous silicon thin film 103 covered by the thin anti-reflective optical film 104 is annealed by excimer laser. As shown in FIG. 4, during the annealing by the excimer laser, the high energy produced by the instant laser pulse is incident on the surface of the amorphous silicon thin film 103 and the energy of the laser light is absorbed by the amorphous silicon thin film 103 instantly. Therefore, no excessive heat is transferred to the substrate 101 and the damage to the substrate 101 is minimized.

Specifically, the process in which the amorphous silicon thin film 103 is converted into the polysilicon thin film may be described as follows. Laser light is incident on the surface of amorphous silicon thin film 103 covered by the thin antireflective optical film 104. The incident laser light is refracted, and the light condensing structures 105 diffuse the laser light incident thereon. The laser light energy density on the amorphous silicon thin film 103a under the light condensing structures 105 is slightly lower than the average laser light energy density and the amorphous silicon thin film 103a has a relative low temperature. Laser light is incident on the surface of amorphous silicon thin film 103 covered by the thin anti-reflective optical film 104. The thin anti-reflective optical film 104 has a thickness of λ/4 on the surface of the unetched region, the reflection loss in the region is almost zero, and the energy of the laser light is completely absorbed by the amorphous silicon thin film 103b under the unetched region such that the energy of the laser light is made full of use. Furthermore, because the light condensing structures 105 diffuse the laser light, the laser light energy density on the amorphous silicon thin film 103b is slightly higher than the average laser light energy density, and the amorphous silicon thin film 103a has a relative high temperature. The light condensing structures 105 are periodically distributed on the surface of the amorphous silicon thin film 103, and due to their function of regulating the laser light energy, the laser light energy is periodically distributed on the surface of the amorphous silicon thin film 103, which results in a periodically distributed temperature gradient in the interior of the amorphous silicon thin film 103 so that temperature of the amorphous silicon thin film 103a under the light condensing structures 105 is low and crystal nuclei 106 are prone to form by crystallization. Under the guidance of the temperature gradient, the crystal nuclei 106 grow to form crystal grain all around and finally a low-temperature polysilicon thin film having large grain and good uniformity is grown.

The grain size and uniformity of the grown low-temperature polysilicon thin film is directly related to the size and uniformity of the light condensing structures 105. The larger the light condensing structures 105, the larger the grain size of the grown low-temperature polysilicon thin film. Generally, the grain size of the low-temperature polysilicon thin film may be increased up to the order of micrometer. The more uniform the distribution of the light condensing structures 105 on the amorphous silicon thin film, the more uniform the grain of the grown low-temperature polysilicon thin film.

The low-temperature polysilicon thin film formed as described above has a large grain size and good uniformity, and thus has excellent electrical characteristic.

In addition, a dehydrogenation process may be preformed on the amorphous silicon thin film 103 before irradiating laser light the amorphous silicon thin film 103 covered by the thin anti-reflective optical film 104 to convert the amorphous silicon thin film 103 into the low-temperature polysilicon thin film. Specifically, the amorphous silicon thin film 103 is baked under the temperature of 450° C. for 2 hours so as to make the content of hydrogen in the amorphous silicon thin film 103 lower than 2% and prevent hydrogen decrepitation during the process of excimer laser annealing.

In the technical solution of the present embodiment, a method for forming a low-temperature polysilicon thin film is provided, and the method comprises covering a thin anti-reflective optical film on an amorphous silicon thin film, forming light condensing structures on the surface of the thin anti-reflective optical film through photolithography and etching, and converting the amorphous silicon thin film into low-temperature polysilicon thin film by excimer laser annealing. The low-temperature polysilicon thin film formed through the above-mentioned method has a large grain size, good uniformity and excellent electrical performance. Furthermore, the above-mentioned method makes full use of the energy of the excimer laser light and facilitates cost reduction and mass production with low cost.

Figure 5:
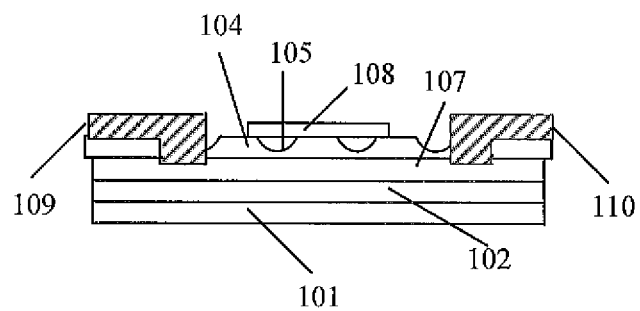
FIG. 5 schematically illustrates the stricture of the low-temperature polysilicon thin film transistor in accordance with an embodiment of the present invention.

The present invention also provides a thin film transistor based on the method described with reference to FIG. 1. As shown in FIG. 5, the thin film transistor comprises an active layer on a substrate 101 and an insulating layer on the active layer. The material of the active layer is a low-temperature polysilicon thin film 107. The insulating film is a thin anti-reflective optical film 104. Light condensing structures 105 are arranged in an array on the surface of the thin anti-reflective optical film 104.

In an embodiment of the present invention, a thin film transistor is provided, and the thin film transistor employs a low-temperature polysilicon thin film with a large grain size and good uniformity as an active layer, which improves the conductivity of the active layer and thus the performance of the low-temperature polysilicon thin film transistor and further improves the display effect of a liquid crystal display.

Specifically, the thickness of the low-temperature polysilicon thin film 107 is 50 nm. There is a thin anti-reflective optical film 104 on the low-temperature polysilicon thin film 107 to function as a gate insulating layer. During the process of fabricating the low-temperature polysilicon thin film transistor, it is not necessary to deposit the gate insulating layer separately. In addition, light condensing structures 105 are distributed in an array on the thin anti-reflective optical film 104. A gate electrode 108 is formed on the thin anti-reflective optical film 104. After that, a source contact region and a drain contact region in the low-temperature polysilicon thin film 107 are doped by using the gate electrode 108 as a mask. A source electrode 109 and a drain electrode 110 are formed on the thus formed source contact region and drain contact region respectively. The source electrode 109 and the drain electrode 110 directly contact the low-temperature polysilicon thin film 107 and a thin film transistor is formed.

In the above thin film transistor, the light condensing structures 105 may be recessed structures with spheral bottom surface arranged in an array on the thin anti-reflective optical film 104. Optionally, the diameter d of the light condensing structure 105 is about 500 nm~5 μm, the minimal distance 1 between edges of two adjacent light condensing structures is about 500 nm~5 μm, and the ratio of the diameter d of the light condensing structure 105 to the minimal distance 1 between edges of two adjacent light condensing structures is about 1:1.

Furthermore, in an embodiment of the present invention, the above-mentioned thin film transistor may further comprise a buffer layer 102, of which the material is a silicon nitride or a silicon oxide.

An embodiment of the present invention further provides a display comprising an above-mentioned thin film transistor. The display device may be any product or component having a function of display such as a liquid crystal panel, an electronic paper, an organic light emitting diode (OLED) panel, a liquid crystal television, a liquid crystal display, a digital photo frame, a mobile phone, a tablet computer.

The above embodiments are provided merely for the purpose of illustrating the technical solutions of the present invention rather than limiting the same. Although the present invention has been described in detail with reference to the above embodiments, one of ordinary skill in the art should understand that he/she may modify the technical solutions described in the above mentioned embodiments or substitute some features therein with equivalents. The modification and substitution do not make their respective technical solutions depart from the scope and spirit of the embodiments of the present invention.

The invention claimed is:

1. A method for forming a polysilicon thin film comprising:
   depositing an amorphous silicon thin film on a base substrate;
   covering the amorphous silicon thin film with an anti-reflective optical film;
   performing photolithography and etching on the anti-reflective optical film such that light condensing structures are provided in an array on the anti-reflective optical film; and
   irradiating the amorphous silicon thin film with the anti-reflective optical film covered by laser light such that the amorphous silicon film is converted into the polysilicon thin film.

2. The method for forming a polysilicon thin film according to claim 1, further comprises performing dehydrogenation on the amorphous silicon thin film before irradiating the amorphous silicon thin film with the anti-reflective optical film covered by laser light such that the amorphous silicon film is converted into the polysilicon thin film.

3. The method for forming a polysilicon thin film according to claim 1, wherein the light condensing structures are recesses with spheral bottom surface.

4. The method for forming a polysilicon thin film according to claim 3, wherein a diameter of the light condensing structure is about 500 nm~5 μm, a minimal distance between edges of two adjacent light condensing structures is about 500 nm~5 μm, and a ratio of the diameter of the light condensing structure 105 to the minimal distance between edges of two adjacent light condensing structures is about 1:1.

5. The method for forming a polysilicon thin film according to claim 1, wherein a thickness of the anti-reflective optical film is a quarter of a wavelength of the laser light.

6. The method for forming a polysilicon thin film according to claim 1, wherein a thickness of the amorphous silicon thin film is 50 nm.

7. The method for forming a polysilicon thin film according to claim 1, further comprises depositing a buffer layer on the substrate before depositing the amorphous silicon thin film on the substrate.

8. The method for forming a polysilicon thin film according to claim 7, wherein a material of the buffer layer is a silicon nitride and a silicon oxide.

9. The method for forming a polysilicon thin film according to claim 1, wherein the laser light is excimer laser light.

\* \* \* \* \*